(12) United States Patent
Bose Jayappa Veeramma et al.

(10) Patent No.: US 8,093,652 B2
(45) Date of Patent: Jan. 10, 2012

(54) BREAKDOWN VOLTAGE FOR POWER DEVICES

(75) Inventors: Subhas C. Bose Jayappa Veeramma, Lampertheim (DE); Ulrich Kelberlau, Lampertheim/Hessen (DE)

(73) Assignee: IXYS Corporation, Milpitas, CA (US)

( * ) Notice: Subject to any disclaimer, the term of this patent is extended or adjusted under 35 U.S.C. 154(b) by 0 days.

(21) Appl. No.: 10/650,451

(22) Filed: Aug. 27, 2003

(65) Prior Publication Data
US 2004/0119087 A1   Jun. 24, 2004

Related U.S. Application Data

(60) Provisional application No. 60/406,881, filed on Aug. 28, 2002.

(51) Int. Cl.
*H01L 29/76* (2006.01)
(52) U.S. Cl. .......... 257/329; 257/491; 257/509
(58) Field of Classification Search ........ 257/132, 257/137, 138, 143, 144, 149, 152, 154, 328–343, 257/491–493, 578–584, 509
See application file for complete search history.

(56) References Cited

U.S. PATENT DOCUMENTS

| | | | | |
|---|---|---|---|---|
| 4,606,781 A * | 8/1986 | Vyne | ............ | 438/10 |
| 4,972,247 A * | 11/1990 | Patterson et al. | ............ | 257/546 |
| 5,024,922 A * | 6/1991 | Moss et al. | ............ | 430/330 |
| 5,101,244 A * | 3/1992 | Mori et al. | ............ | 257/471 |
| 5,138,415 A * | 8/1992 | Yano | ............ | 257/113 |
| 5,241,210 A * | 8/1993 | Nakagawa et al. | ............ | 257/487 |
| 5,262,754 A * | 11/1993 | Collins | ............ | 338/21 |
| 5,316,964 A * | 5/1994 | Gross | ............ | 438/383 |
| 5,698,454 A | 12/1997 | Zommer | | |
| 5,994,189 A * | 11/1999 | Akiyama | ............ | 438/268 |
| 6,091,086 A | 7/2000 | Zommer | | |

FOREIGN PATENT DOCUMENTS

| | | |
|---|---|---|
| DE | 198 43 537 A1 | 4/2000 |
| EP | 0 361 318 B1 | 4/1990 |

* cited by examiner

*Primary Examiner* — Ori Nadav

(74) *Attorney, Agent, or Firm* — Kilpatrick Townsend & Stockton LLP

(57) ABSTRACT

A power device includes a semiconductor substrate of first conductivity having an upper surface and a lower surface. An isolation diffusion region of second conductivity is provided at a periphery of the substrate and extends from the upper surface to the lower surface of the substrate. The isolation diffusion region has a first surface corresponding to the upper surface of the substrate and a second surface corresponding to the lower surface. A peripheral junction region of second conductivity is formed at least partly within the isolation diffusion region and formed proximate the first surface of the isolation diffusion region. First and second terminals are provided.

12 Claims, 7 Drawing Sheets

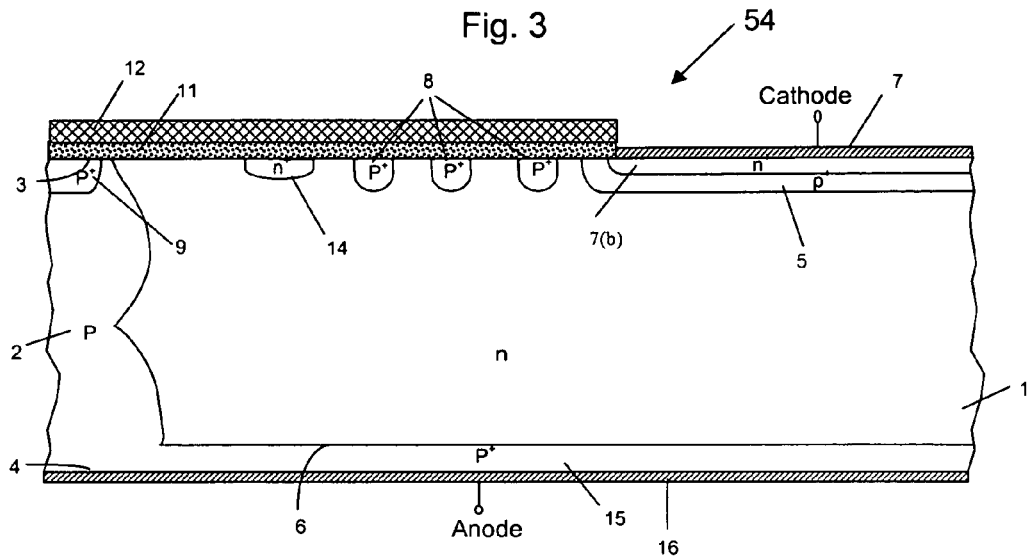
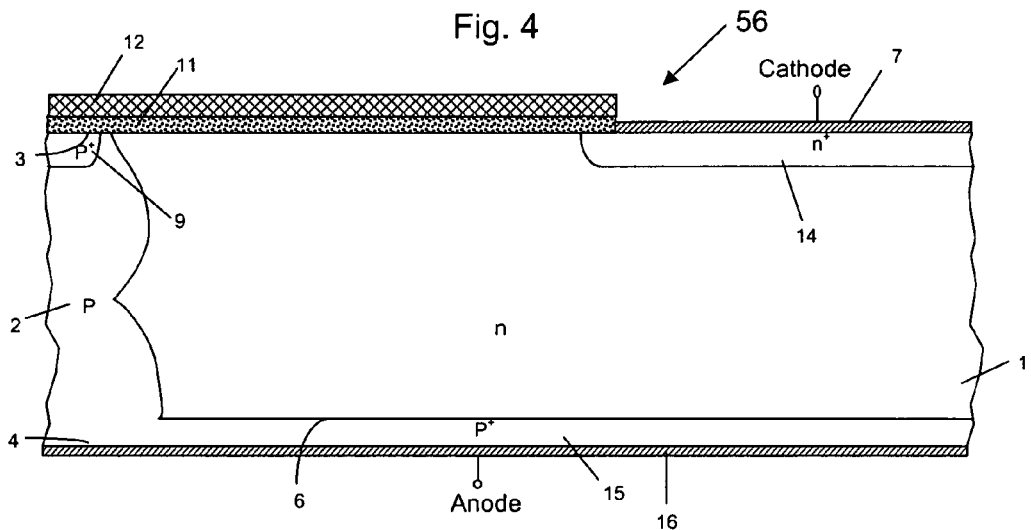
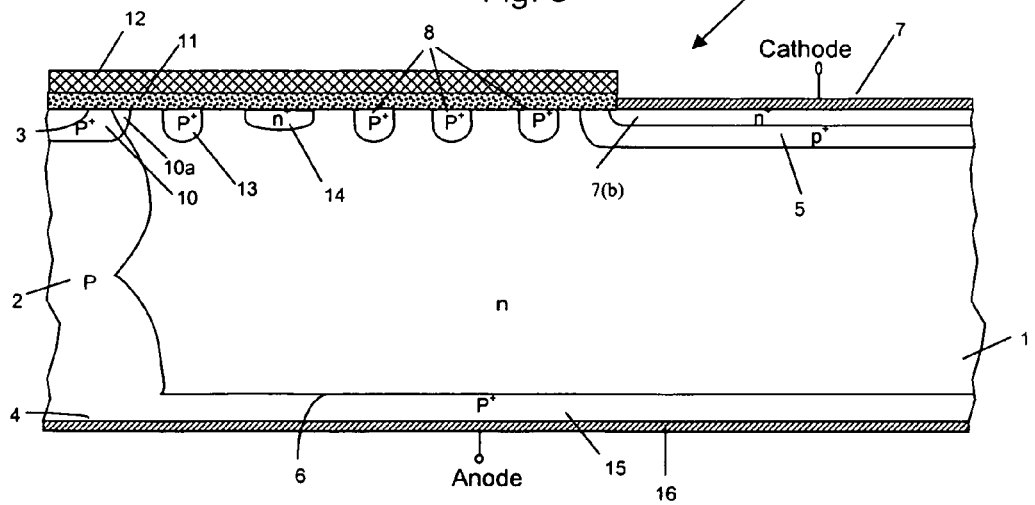

BREAKDOWN VOLTAGE FOR POWER DEVICES

CROSS-REFERENCES TO RELATED APPLICATIONS

The present application claims priority to U.S. Provisional Patent Application No. 60/406,881, filed on Aug. 28, 2002, which is incorporated by reference.

BACKGROUND OF THE INVENTION

The present invention relates to integrated circuit devices, and in particular high voltage transistors, power MOSFETs, IGBTs, thyristors, MCTs, diode, and the like ("power devices").

A power device is a device that is capable of handling currents in excess of 1 A and/or handles 50 volts or more. Some power devices are configured to handle 10 kA or more and/or 4 kV. Generally, power devices handle few hundred volts or more. The power device may be two terminal devices, e.g., diodes, or three terminal devices, e.g., transistors. In the three terminal devices, the control terminals (e.g., base or gate) determines the characteristics of the conduction path between the two other terminals or conduction terminals. These terminals are the emitter and collector in the bipolar transistor, and the source and drain in the field-effect transistor, and the anode and cathode in the thryristors. The control function can be exercised either by the injection of current or through the voltage of the control electrode. If the injection of current is used the control electrode makes a direct contact with the semiconductor substrate. If the voltage of the control electrode is used, the control electrode is separated from the substrate by a dielectric layer to prevent current flow between the control electrode and the substrate.

The power devices are rated according to their blocking voltage capability. Generally, there are two types of blocking voltages: forward blocking voltage and reverse blocking voltage. Regardless of the types of the power devices, there is a great interest in providing a power device that has an improved forward blocking voltage or reverse blocking voltage, or both since such a device would tend to be more robust and could be used in wider applications.

BRIEF SUMMARY OF THE INVENTION

In one embodiment, a power device includes a semiconductor substrate of first conductivity having an upper surface and a lower surface. An isolation diffusion region of second conductivity is provided at a periphery of the substrate and extends from the upper surface to the lower surface of the substrate. The isolation diffusion region has a first surface corresponding to the upper surface of the substrate and a second surface corresponding to the lower surface. A peripheral junction region of second conductivity is formed at least partly within the isolation diffusion region and formed proximate the first surface of the isolation diffusion region. First and second terminals are provided.

In another embodiment, a power device, comprising: a semiconductor substrate of first conductivity having an upper surface and a lower surface; an isolation diffusion region of second conductivity provided at a periphery of the substrate and extending from the upper surface to the lower surface of the substrate, the isolation diffusion region having a first surface corresponding to the upper surface of the substrate and a second surface corresponding to the lower surface; a peripheral junction region of second conductivity formed entirely within the isolation diffusion region and formed proximate the first surface of the isolation diffusion region, the peripheral junction region having a first depth; a first shallow junction region of second conductivity overlying the peripheral junction region, the first shallow junction region including an outward extension that extends outside of the isolation diffusion region, the first shallow junction region having a second depth that is less than the first depth; a first main junction region proximate the upper surface; and first and second terminals.

BRIEF DESCRIPTION OF THE DRAWINGS

FIG. 3 shows a power device configured to handle relatively high forward and reverse blocking voltages according to one embodiment of the present invention.

FIG. 4 illustrates a diode according to one embodiment of the present invention.

FIG. 5 illustrates a thrysistor according to one embodiment of the present invention.

DETAILED DESCRIPTION OF THE INVENTION

Figure 1:
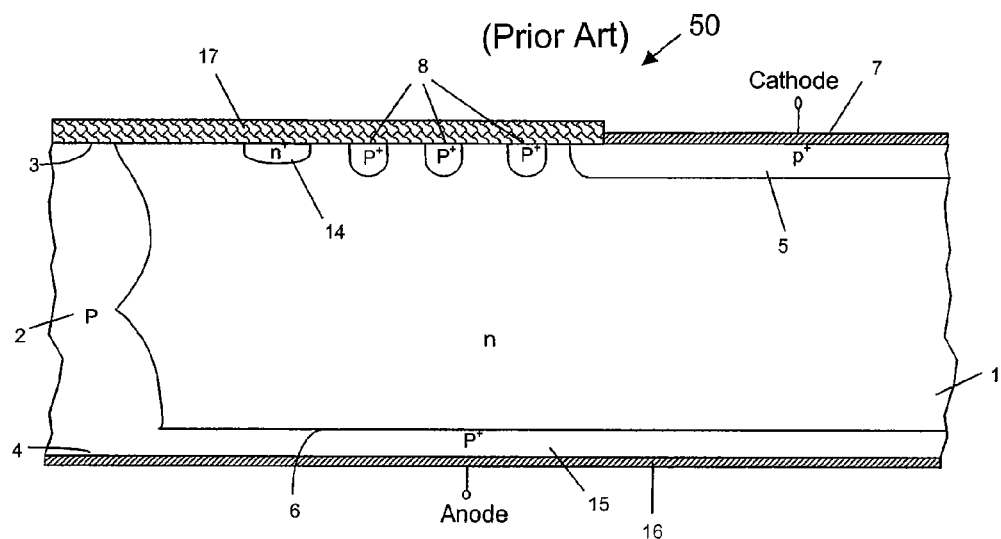
FIG. 1 shows a conventional power device.

FIG. 1 shows a conventional power device 50, also referred to as a silicon controlled rectifier (SCR) or thyristor. The device 50 includes an isolation diffusion region 2 that extends from an upper surface 3 and a lower surface 4 of a semiconductor substrate 1. A glass passivation layer 17 is provided on the upper surface of the substrate to prevent contamination or damage to the device. Other dielectric materials may be used. A channel stopper 14 and a plurality of guard rings 8 are provided on the upper surface. The channel stopper is an N+ type region. The guard rings are P+ regions. A conductive regions 5 and 15 are provided on the upper surface and the lower surface, respectively, of the substrate. The conductive regions 5 and 15 are P+ regions. A cathode 7 is formed on the upper surface. An anode 16 is formed on the lower surface. The anode and cathode are formed from aluminum.

As used herein, the terms "N− type region," "N type region," and "N+ type region" are terms used to described the relative dopant concentration levels of the conductive regions in a given power device. That is, the term "N+ type region" indicates that that regions has a higher dopant concentration level than the "N type region." Accordingly, no maximum or minimum concentration levels should be read into the use of these terms. Similarly, no maximum or minimum concentration levels should be read into the use of terms "P type region" and "P+ type region."

Generally, the device provides a forward blocking voltage that is about 85% of the bulk breakdown voltage and a reverse blocking voltage that is about 95% of the bulk breakdown voltage with less leakage current. However, the present inventors noted that the reverse blocking voltage reduces to 60% of the bulk breakdown voltage with an increased leakage current if oxide and polyimid layers are used as a passivation layer.

Figure 2:
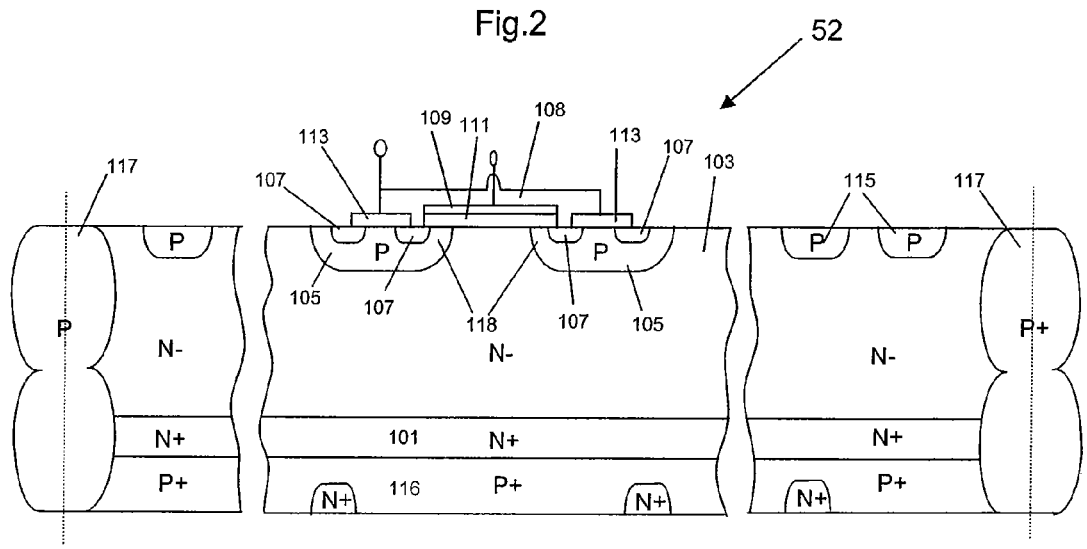
FIG. 2 shows a cross-sectional view of an IGBT device.

FIG. 2 shows a cross-sectional view of an IGBT device 52. The IGBT device may be formed by a double diffused MOS process (DMOS) and the like. The device 52 includes an N+ type semiconductor substrate 101. An N− type layer 103 is formed overlying the N+ type semiconductor substrate 101. The N− type layer 103 is often an epitaxial layer or the like. P/P+ type well regions 105 are defined on the N− type layer 103. The device also includes a plurality of N type source regions 107 defined into a perimeter of each P/P+ type well region 105. A gate polysilicon layer (G) 109 is defined overlying a thin layer of gate oxide 111 and the like. Source metallization 113 is defined overlying the N type source regions 107, and connects 108 each source region together. A P type diffusion region 116 is defined overlying the backside of the N+ type substrate. The P type diffusion region is a P+ type drain region. A channel region 118 is defined in a portion of the P/P+ type well region between the source region 107 and a portion of the N− type layer 103.

The device includes a plurality of guard ring structures 115. The guard ring structures are P type regions, typically surrounding the periphery of the integrated circuit chip active cell region to increase the forward blocking voltage of the device. A field plate (not shown) made of polysilicon is often defined overlying the guard ring structures. The guard ring structure tends to keep the main conduction region toward the active cell region of the integrated circuit chip, thereby preserving the voltage rating of the device. Generally, boron is used as the dopant for the guard ring.

An isolation diffusion region or P type region 117 defines the scribe line of the device. Aluminum is used to form the isolation region due to its high mobility rate. In one embodiment, boron may be used for formation of the upper portion of the isolation region, and aluminum is used for formation of the lower portion of the isolation region. The isolation region 117 creates a "wrap around" P type envelope covering sides of the die including the bottom P+ type drain region. The region 117 is provided to eliminates the exposed P+/N+ junction and increase the reverse blocking voltage of the device. This device generally does not provide a high blocking voltage due to the presence of N+ buffer layer 101. The inventor also noted that the use of the oxide and polymid rather than glass as the passivation layer on the device 52 resulted in reduced reverse blocking voltages and increased leakage currents.

Currently, the power devices configured to handle high forward and reverse blocking voltages use glass as the passivation layer. With the glass passivation, the power devices are provided with high forward and reverse blocking voltages and low leakage current (e.g., less than 500 micro amps at room temperature). Glass has low fixed charges so it does not influence the low surface concentration of isolation diffusion that results in low leakage current at breakdown.

However, the glass passivation may not be used for wafer size greater than 5 inch, e.g., 6 inch or greater. The present inventors noted that wafers processed with glass passivation showed tendency to bend if 6 inch wafer were used. This bending problem results from the differences between the thermal expansion coefficients of the glass and silicon wafer. The bending is not a significant issue under the current state of art, which uses 5 inch wafer, for fabricating power devices. An appropriate substitute for glass would be needed in order to migrate to 6 inch or 8 inch wafers. Also, the glass passivation is sensitive to the humidity and requires higher manufacturing costs since separate equipment is need to spray on the glass to the wafer.

One possible substitute is the oxide and polymid. Generally, an oxide layer is formed on the substrate and then a polymid layer is deposited on the oxide layer to form a two-layer passivation. Although the forward blocking voltage is not effected, the use of the oxide and polymid as the passivation layer causes the reverse blocking voltage to be lowered due to relatively high fixed charges associated with the oxide layer. That is, the reverse blocking voltage decreases with the increase in oxide charge since the impact ionization rate increases at the PN junction defined at the upper portion of the isolation diffusion region with the increase in oxide charge. Table A below shows the influence of oxide charge on the reverse blocking voltages for an exemplary thyristor, such as that illustrated in FIG. 1 and fabricated with the parameters provided in Table B.

TABLE A

| Fixed oxide charge (cm$^{-2}$) | Breakdown voltage |
| --- | --- |
| −1E11 | 2311 volts |
| 0 | 2302 volts |
| 1E11 | 2218 volts |
| 2E11 | 1918 volts |
| 3E11 | 1677 volts |

TABLE B

| | |
| --- | --- |
| Substrate resistivity | 77 Ohm-cm (5.57 × 10$^{13}$ cm − 3) |
| Channel stopper surface concentration | 1 × 10$^{20}$ cm$^{-3}$ |
| Channel stopper junction depth | 20 μm |
| Boron dose | 2.8 × 10$^{15}$ cm$^{-2}$ |
| Boron junction depth (Guard rings 8) | 44 μm |
| Guard ring mask window size | 10 μm |
| Surface concentration of isolation diffusion | 1 × 10$^{17}$ cm$^{-3}$ |
| Lateral diffusion of Al diffusion | 0.7 times the Al junction depth |
| Substrate thickness | 380 μm |

In addition to the decrease in reverse blocking voltage, an increased leakage current was detected, e.g., more than 5 mA at room temperature. The present inventor believes that the increase in leakage current is due to surface depletion of aluminum isolation region (diffusion zone) and relatively high fixed charge of the oxide. The surface depletion results from the long diffusion step used to diffuse aluminum into the substrate, so that relatively low concentration of aluminum exists on the surface.

In one embodiment, high concentration of boron is introduced into the isolation region in order to reduce the leakage current and increase the reverse blocking voltage. The concentration of the boron may be varied according to the application. A single guard ring provided between the isolation diffusion region and channel stopper to reduce the electric field at the PN junction of isolation diffusion and increase the breakdown voltage. In another embodiment a plurality of guard rings are provided between the channel stopper and isolation diffusion regions. The plurality of guard rings may be shallow guard rings that are formed using a separate implantation/diffusion step from that used to form the conventional guard rings 8.

The features of the present embodiments described herein relates to fabrication of power devices using 6 inch wafer or greater using a passivation layer that is not made of glass. Examples of alternatives to the glass passivation are the oxide/polymid passivation, the oxide/silicon nitride/polymid passivation, and the diamond-like-carbon/polymid passivation. However, the present embodiments may also be implemented using glass passivation technology or glass/polymid technology, or 5 inch wafer technology, or the like.

FIG. 3 shows a power device 54 configured to handle relatively high forward and reverse blocking voltages according to one embodiment of the present invention. The device 54 is a thyristor like the device 50 and has similar structures. Accordingly, the same numerals are used to denote the corresponding structures in the two devices. Generally, an n+ region (not shown) is defined inside the layer 5 for a thyristor.

The device 54 includes an isolation diffusion region 2 that extends from an upper surface 3 to a lower surface 4 of a semiconductor substrate 1. The substrate has resistivity of about 77 Ohm-cm ($5.57 \times 10^{13}$ cm$^{-3}$) and has thickness of about 380 µm. The surface concentration of the isolation diffusion region is formed by diffusing aluminum vertically into the substrate from the upper and lower surfaces of the substrate. Surface concentration of the isolation diffusion region is provided to be about $1 \times 10^{17}$ cm$^{-3}$. The lateral aluminum diffusion is about 0.7 times the aluminum junction depth. In one embodiment, two more dopants may be used to form the isolation diffusion region, e.g., use boron to form an upper portion of the isolation region and aluminum to form a lower portion of the isolation region.

An oxide layer 11 and a polymid layer 12 are provided on the upper surface of the substrate as dual passivation layers to prevent contamination or damage to the device. Other dielectric materials may be used.

A plurality of guard rings 8 are provided on the upper surface of the substrate. The guard rings are P+ regions and are provided to increase the forward blocking voltage of the device. The guard rings 8 may also be referred to as guard rings of first type or forward blocking guard rings.

A peripheral junction region 9 is formed inside of the isolation diffusion region proximate the upper surface of the substrate. The region 9 is a P+ region and is provided to increase the reverse blocking voltage of the device by reducing the electric field at an upper PN junction associated with the isolation diffusion region. The peripheral junction region 9 is provided to compensate for the surface depletion of aluminum. In the present embodiment boron is used as the dopant, but other dopants including aluminum may be used. The peripheral junction region is provided entirely within the isolation diffusion region. High electric field results if the peripheral region extends outside of the isolation diffusion region. In such a configuration, a guard ring of second type would be needed, as will be explained later.

A first and second conductive regions 5 and 15 are provided on the upper surface and the lower surface, respectively, of the substrate. These regions are P+ regions. They may also be referred to as first and second main junction regions. The guard rings 8, peripheral junction region 9, and conductive regions 5 and 15 are formed at the same time in the present embodiment using boron as the dopant. Boron concentration for these regions are about $2.8 \times 10^{15}$ cm$^{-2}$. The boron concentration may be varied according to the application. In one embodiment, the boron concentration is about 5E17 cm$^{-3}$ to 1E19 cm$^{-3}$. The junction depths are about 44 µm. The depth may be 35-45 µm, or 30-50 µm.

A channel stopper 14 is provided on the upper surface between the guard rings 8 and the isolation diffusion region. The channel stopper is an N+ type region and is configured to reduce electricity field at the upper portion of the substrate. Surface concentration of the channel stopper is about $1 \times 10^{20}$ cm$^{-3}$. The junction depth of the channel stopper is about 20 µm.

A cathode 7 is formed on the upper surface. An anode 16 is formed on the lower surface. The anode and cathode are formed from aluminum in the present embodiment.

FIG. 4 illustrates a power device 56 according to one embodiment of the present invention. The device 56 is a diode and has similar configuration as the device 54. However, the device 54 does not include the guard rings 8 and channel stopper 14 since it is a diode. Also the device has a first main junction 14 that is an N+ type region rather than a P+ region.

FIG. 5 illustrates a power device 58 according to one embodiment of the present invention. The device 58 is a thyristor configured to handled high forward and reverse blocking voltages. The device has a peripheral junction region 10 that extends outside of the isolation diffusion region. The peripheral junction region 10 is also referred to as a junction extension region or JE region. The junction extension 10 rather than the peripheral junction region 9 is used in the device 56 since the latter does not covers the entire upper surface of the isolation region. The junction extension has an outward extension 10a that extends outside of the isolation diffusion region since it is difficult to make the junction extension end preciously at the edge of the isolation diffusion region.

The outward extension of the junction extension, however, causes curvature effect and generates increased electric field at that place. This would lead to increased impact ionization and premature breakdown.

A guard ring 13 is provided between the channel stopper 14 and the isolation diffusion region 2 to increase the reverse blocking voltage, preferably to the bulk breakdown voltage. The guard ring 13 is a P+ region and is configured to reduce the electric field between the peripheral junction region 10 and the substrate (i.e., P+/N junction). The guard ring 13 is spaced apart to an optimal distance from the isolation diffusion region for that purpose. The guard ring 13 is formed using a 10 µm mask window. The guard ring 13 has boron concentration of 5E17 to 1E19 cm$^{-3}$ and has a depth of 35-45 µm, or 30-50 µm. The guard ring 13 is also referred to as a guard ring of second type, reverse blocking guard ring, or field limiting ring. In one embodiment, the guard ring of second type 13 is formed together with the guard rings of first type 8, JE region 10, and the main junction 15.

Figure 6:
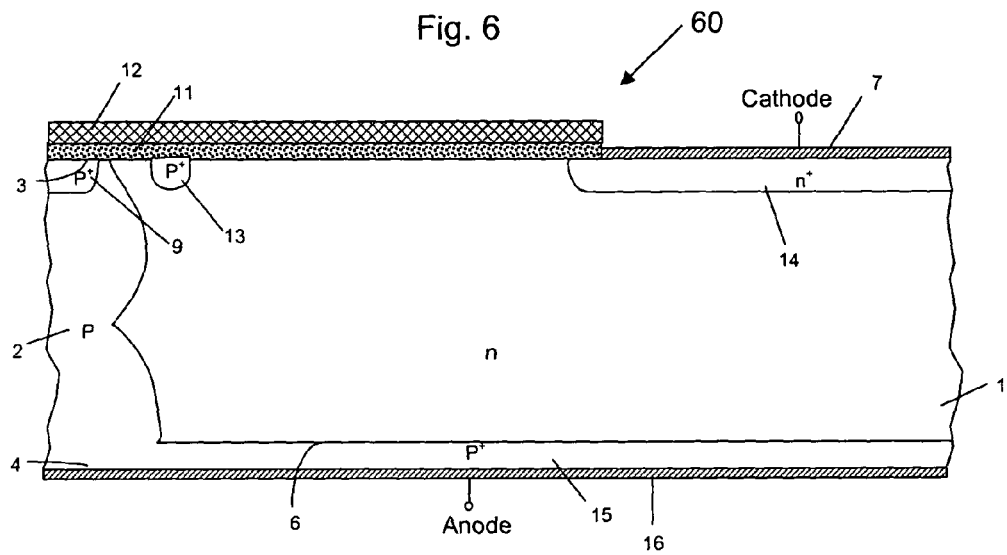
FIG. 6 illustrates a power device according to one embodiment of the present invention.

FIG. 6 illustrates a power device 60 according to one embodiment of the present invention. The device 60 is a diode and includes a guard ring of second type 13 to increase the breakdown voltage. The device 60 does not include the guard rings of first type 8 and channel stopper 14 since it is a diode. The device also has a first main junction region 14 that is an N+ region rather than a P+ region.

Figure 7:
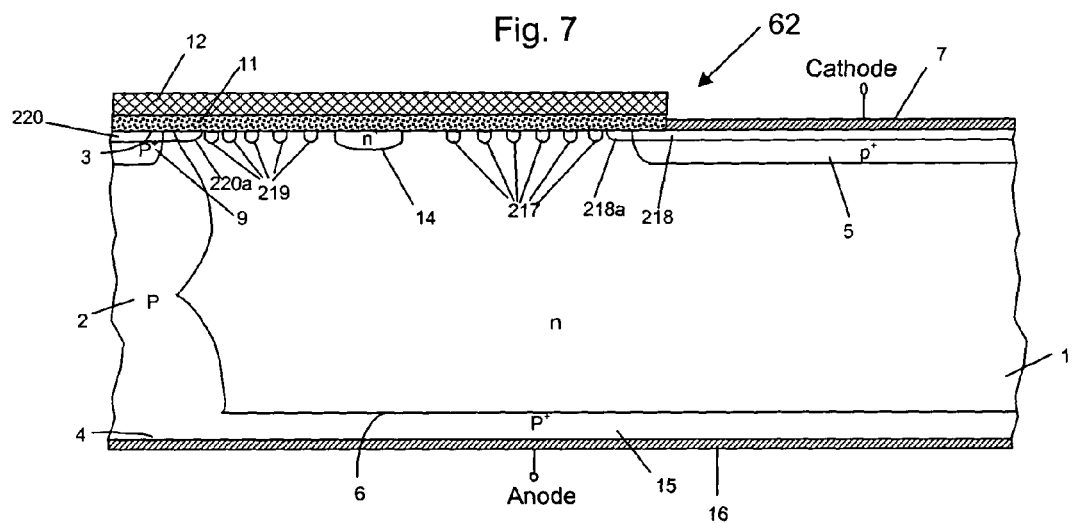
FIG. 7 illustrates a power device configured to handle high forward and reverse blocking voltages according to one embodiment of the present invention.

FIG. 7 illustrates a power device 62 configured to handle high forward and reverse blocking voltages according to one embodiment of the present invention. The device 62 is a thyristor like the device 54 and has similar structures. Accordingly, the same numerals are used to denote the corresponding structures in the two devices.

The device 62 includes an isolation diffusion region 2 that extends from an upper surface 3 to a lower surface 4 of a semiconductor substrate 1. The substrate has resistivity of about 77 Ohm-cm ($5.57\times10^{13}$ cm$^{-3}$) and has thickness of about 380 µm. The surface concentration of the isolation diffusion region is formed by diffusing aluminum vertically into the substrate from the upper and lower surfaces of the substrate. Surface concentration of the isolation diffusion region is provided to be about $1\times10^{17}$ cm$^{-3}$. The lateral aluminum diffusion is about 0.7 times the aluminum junction depth. In one embodiment, two or more dopants may be used to form the isolation diffusion region, e.g., use boron to form an upper portion of the isolation region and aluminum to form a lower portion of the isolation region.

An oxide layer 11 and a polymid layer 12 are provided on the upper surface of the substrate as dual passivation layers to prevent contamination or damage to the device. Other dielectric materials may be used, e.g., silicon nitride, diamond-like-carbon, and the like.

A peripheral junction region 9 is formed inside of the isolation diffusion region proximate the upper surface of the substrate. The region 9 is a P+ region and is provided to increase the reverse blocking voltage of the device by reducing the electric field at an upper PN junction of the isolation diffusion region. The peripheral junction region 9 is provided to compensate for the surface depletion of aluminum. In the present embodiment boron is used as the dopant, but other dopants including aluminum may be used. The peripheral junction region is provided entirely within the isolation diffusion region. High electric field results if the peripheral region extends outside of the isolation diffusion region. The junction depth is about 44 µm, but may be 35-45 µm, or 30-50 µm.

A first and second conductive regions 5 and 15 are provided on the upper surface and the lower surface, respectively, of the substrate. These regions are P+ regions. They may also be referred to as first and second main junction regions. The peripheral junction region 9 and conductive regions 5 and 15 are formed at the same time in the present embodiment using boron as the dopant. Boron concentration for these regions are about $2.8\times10^{15}$ cm$^{-2}$. The boron concentration may be varied according to the application. In one embodiment, the boron concentration is about 5E17 cm$^{-3}$ to 1E19 cm$^{-3}$. The junction depths are about 44 µm. The depth may be 35-45 µm, or 30-50 µm.

A cathode 7 is formed on the upper surface, overlying the first main junction region. An anode 16 is formed on the lower surface, overlying the second main junction region. The anode and cathode are formed from aluminum in the present embodiment.

A plurality of guard rings of first type 217 are provided on the upper surface of the substrate. The guard rings are P regions and are provided to increase the forward blocking voltage of the device. The guard rings 217 extend no more than 20 µm or no more than 15 µm in one embodiment. In the present embodiment, the rings are configured to have depths of about 7-15 µm, preferably about 10 µm. A window size of about 9 µm is used to form the 10 µm depth guard rings 217. Surface concentration of the guard rings 217 is about 1E16 cm$^{-3}$ to 5E17 cm$^{-3}$. The plurality of shallow guard rings provide fine tuning and robustness. The guard rings may also be referred to as forward blocking guard rings or field limiting rings or shallow junction guard rings.

Figure 9A:
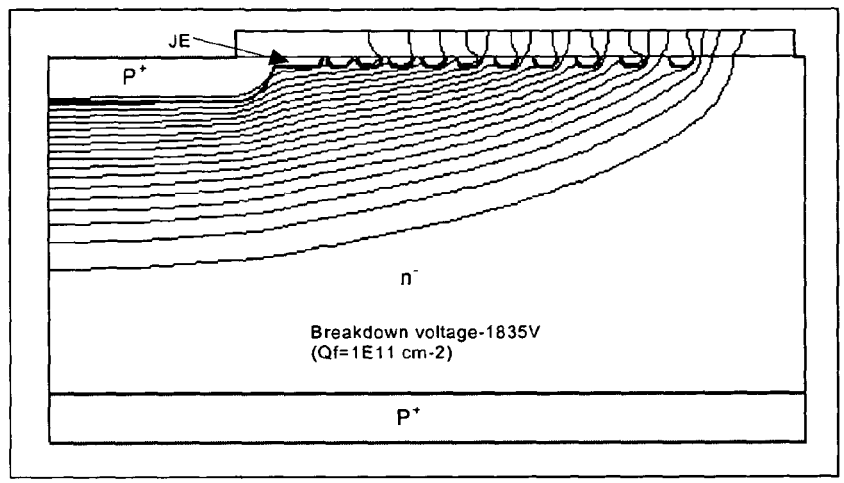
FIG. 9A shows potential contours for a power with the shallow junction extension (JE) region and fixed oxide charge of 1E11 $cm^{-2}$.
Figure 9B:
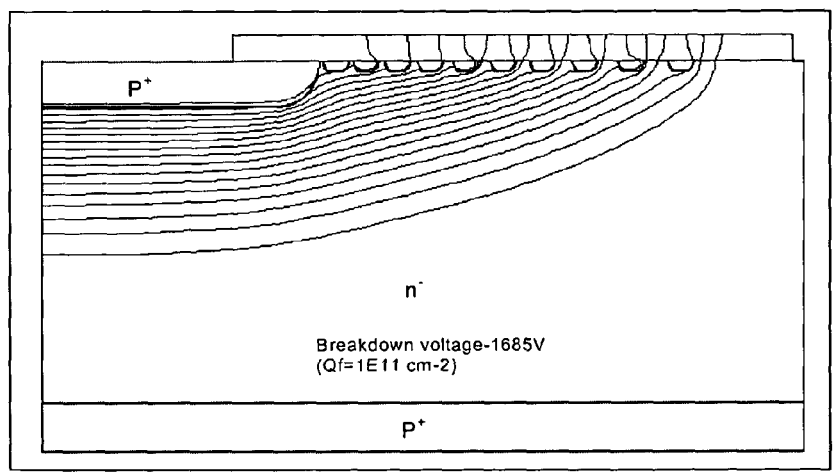
FIG. 9B shows a power device without the shallow junction extension (JE) region.

A first shallow junction region 218 is formed on the first main junction region 5. The first shallow junction region 218 is formed using the same process step as that of the shallow junction guard rings 217. These two structures have similar dopant concentration levels and depths. The first shallow junction region includes an outward extension 218a that extends outside of the first main junction 5. The region 218 is provided to increase the forward breakdown voltage by pushing equipotential contours to the guard rings 217. Without it, high electric field is generated between the first main junction region 5 and the substrate 1 due the process mismatch between the first main junction 5 and the shallow junction guard rings 217. The first shallow junction region 218 is provided to allow alignment tolerance between the deep junction structure (i.e., the first main junction region 5) and the shallow junction region (i.e., the guard rings 217). In the present embodiment, the guard rings 217 has about ¼ the depth of the first main junction region 5. FIG. 9A shows potential contours for the device 62 with the shallow junction region 218 and fixed oxide charge of 1E11 cm$^{-2}$. FIG. 9B shows a similar device without the shallow junction region 218. The breakdown voltage decreases from 1835 volts to 1685 volts.

A channel stopper 14 is provided on the upper surface between the guard rings 218 and the isolation diffusion region. The channel stopper is an N+ type region and is configured to reduce electricity field at the upper portion of the substrate. Surface concentration of the channel stopper is about $1\times10^{20}$ cm$^{-3}$. The junction depth of the channel stopper is about 20 µm.

A second shallow junction region 220 is formed on the peripheral junction region 9. The second shallow junction region 220 has low dopant concentration when compared to the peripheral junction region 9. The region 220 has boron concentration of about 1E16-5E17 cm$^{-3}$ and has depth of about 7-15 µm, preferably about 10 µm. The region 220 is a P region. In one embodiment, the depth is 20 µm or less. The second shallow junction region 220 is formed at the same time as the guard rings 217 and first shallow junction 218 in the present embodiment.

The second shallow junction region 220 has an outward extension 220a that extends outside of the isolation diffusion region. The low concentration of boron outside of the isolation diffusion region causes a curvature effect at the P/N junction defined by the outward extension 220a and the substrate 1. This increases electric field at that location and causes premature breakdown.

A plurality of shallow junction guard rings 219 are provided proximate the isolation diffusion region and the outward extension of the second shallow junction region, i.e., between the isolation diffusion region and the channel stopper. The guard rings 219 increase the reverse blocking breakdown voltage and are configured to handle the increased electric field generated at the P/N junction defined by the second shallow junction and the substrate. The guard rings 219 extend no more than 20 µm deep in one embodiment, and no more than 15 µm in another embodiment. In the present embodiment, the rings are configured to have depths of about 7-15 µm, preferably about 10 µm. A window size of about 9 µm is used to form the 10 µm depth guard rings 219. Surface concentration of the guard rings is about 1E16 cm$^{-3}$ to 5E17 cm$^{-3}$.

In the present embodiment, 10 shallow junction guard rings 219 are used in place of the single guard ring 13 of the device 58. The guard rings are spaced apart in such a way to reduce the electric field between the P/N junction and the guard rings 219. The guard rings 219 are formed at the same time with the guard rings 218 and the first and second shallow junction regions 218 and 220 in the present embodiment. These structures are formed separately from the first main junction and the peripheral junction region. The guard rings 219 may also be referred to as reverse blocking guard rings or field limiting rings or shallow junction guard rings.

Figure 8:
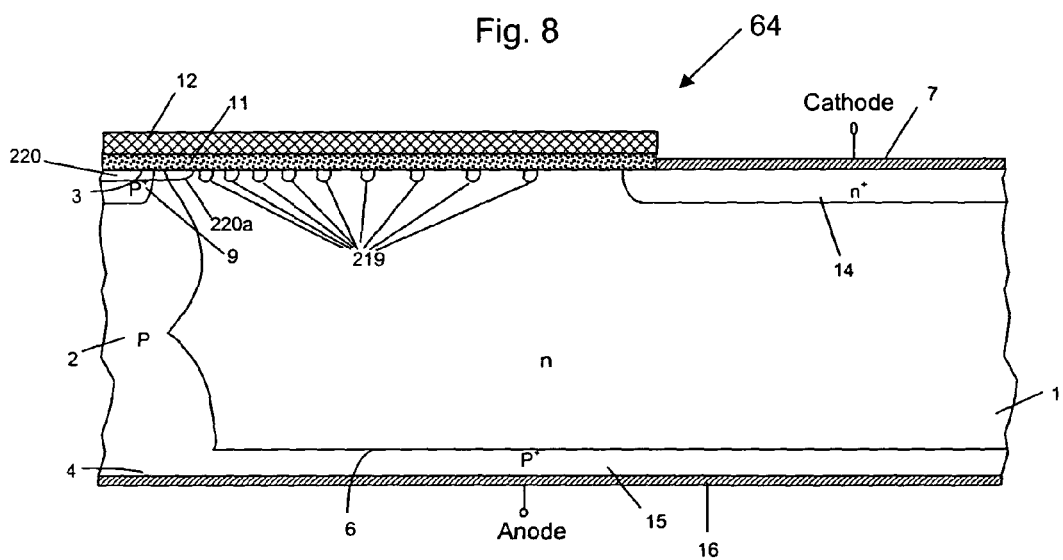
FIG. 8 illustrates a power device that has a plurality of shallow junction guard rings.

FIG. 8 illustrates a power device 64 that has a plurality of shallow junction guard rings 219. The device 64 has a peripheral junction region 9 and a second shallow junction 220, as in the device 62. However, the device 64 does not includes a channel stopper 14, shallow junction guard rings 218, and first shallow junction region 218 since the device is a diode.

Figure 10:
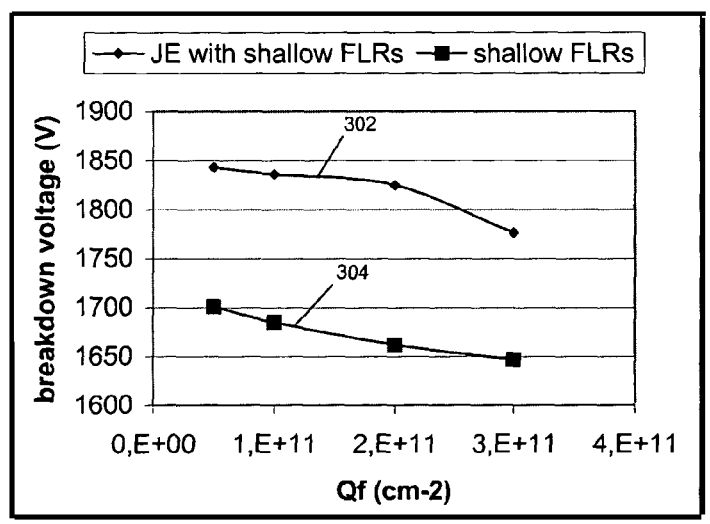
FIG. 10 illustrates forward breakdown voltage graphs associated with a device having the first shallow junction region and shallow junction guard rings.

FIG. 10 illustrates forward breakdown voltage graphs associated with the device 62 having the first shallow junction region 218 and shallow junction guard rings 219. A graph 302 shows the effects on the breakdown voltage of the device as the oxide charges increases. A graph 304 indicates the effects on the breakdown voltage of a device that, unlike the device 62, does not have the first shallow junction region. Both graphs show only 3-4% degradation in the breakdown voltage as the oxide charge increases. These graphs indicate that the shallow junction region does not significantly affect the forward breakdown voltage.

The present inventor has also determined that the device 62 is not sensitive to the design or process tolerance from active boron mask to the guard ring structures due to the presence of the shallow junction region. Often times there is some variation, e.g., about 5%, in the junction depth from one process to another. The guard rings, therefore, need to be designed so that such a process variation does not cause serious degradation in the breakdown voltage. The process variation includes the differences in the junction depth and oxide charge.

Figure 11A:
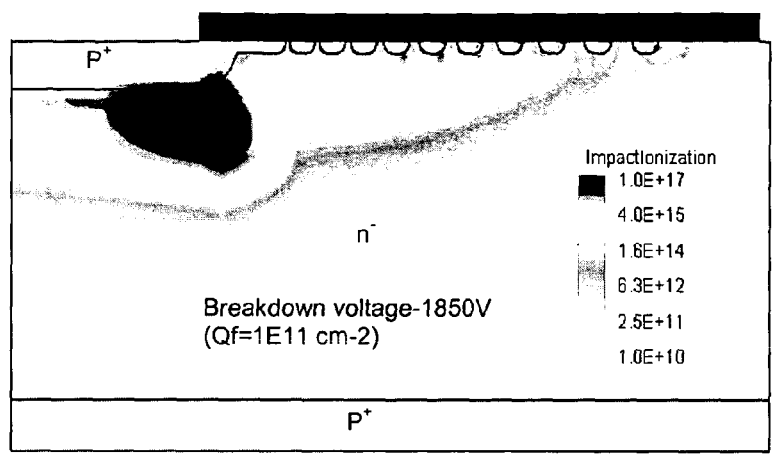
FIGS. 11A-11C illustrate a simulation performed with respect to the forward blocking voltage on a power device.
Figure 11B:
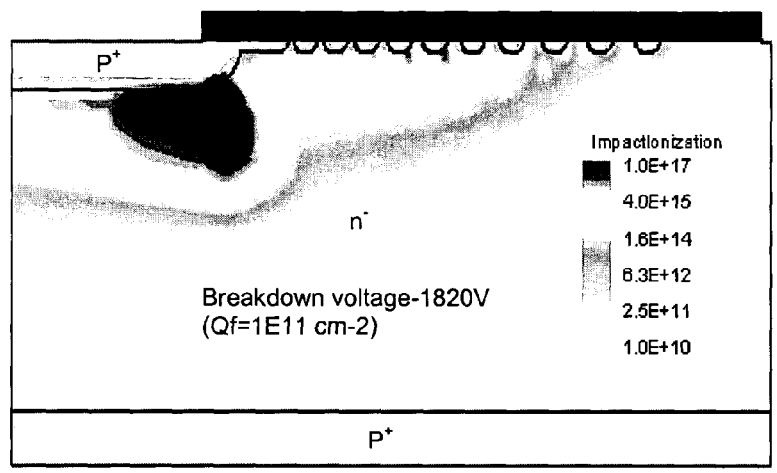
Figure 11C:
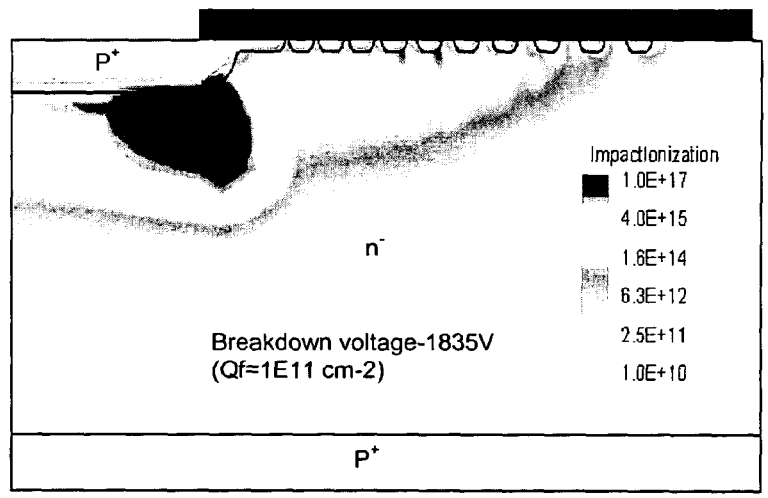

Referring to FIGS. 11A-11C illustrate a simulation performed by the present inventor with respect to the forward blocking voltage on the power device 62 that is provided with a shallow junction region 218 and 10 shallow guard rings 217. It is relatively easier to design a power device with high breakdown voltages and low sensitivity to the process variation since each guard ring share in potential.

According to the experiment, if the junction depth is increased from the default depth of 10 µm to 10.5 µm due to process variation, although the first two shallow guard rings 217 proximate the shallow junction region 218 contribute less sharing in potential, the last two shallow guard rings 217 share in potential since the impact ionization occurs in the last ring (FIG. 11A). The breakdown voltage was determined to be 1850 volts. The first two shallow guard rings may also be referred to as the 1st and 2nd guard rings, and the last two guard rings are referred to as the 9th and 10th guard rings.

If the junction depth is decreased from the default depth of 10 µm to 9.5 µm, the 10th guard ring does not share high potential with the substrate because the impact ionization rate is low at the last or 10th ring (FIG. 11B). The breakdown voltage was determined to be 1820 volts. FIG. 11C illustrates the impact ionization for the device 62 associated with the default depth of 10 µm. The breakdown voltage was determined to be 1835 volts. Accordingly, the differences in the breakdown voltage from the process variation was only 15 volts from the default configuration. This experiment indicates that the 1st and 10th ring may be used for fine-tuning purposes.

Figure 12A:
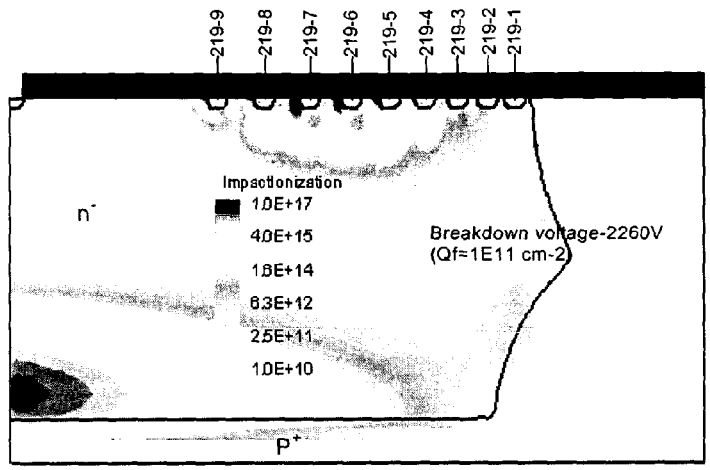
FIGS. 12A-12C illustrate impact ionization associated with a power device.

FIG. 12A illustrates impact ionization associated with the power device 62 provided with 9 shallow junction guard rings 219 and the resulting reverse blocking voltage. The guard rings are denoted with numerals 219-1 to 219-9, the first ring proximate the isolation diffusion is referred to as the first ring 219-1, and the next ring is referred to as the second ring 219-2, and so on. The device was determined to have the breakdown voltage of 2260 volts. As explained above in connection with FIG. 7, the device 62 is provided with the peripheral junction region 9 formed in the isolation diffusion region 2. The region 9 has a depth of 44 µm and is provided with high concentration of boron. The junction extension region 220 having low boron concentration level is formed on the region 9. These two regions together completely cover the upper surface of the isolation region or the lateral diffusion of aluminum. The lateral diffusion of aluminum isolation diffusion may be about 70% of the junction depth. One advantage of providing the regions 9 and 220 inside the aluminum isolation diffusion is that they eliminate the surface depletion associated with the isolation diffusion structure, thereby reducing the device's sensitivity to the oxide charge or device fabrication process, e.g., plasma processing to etch negative photoresist.

Figure 12B:
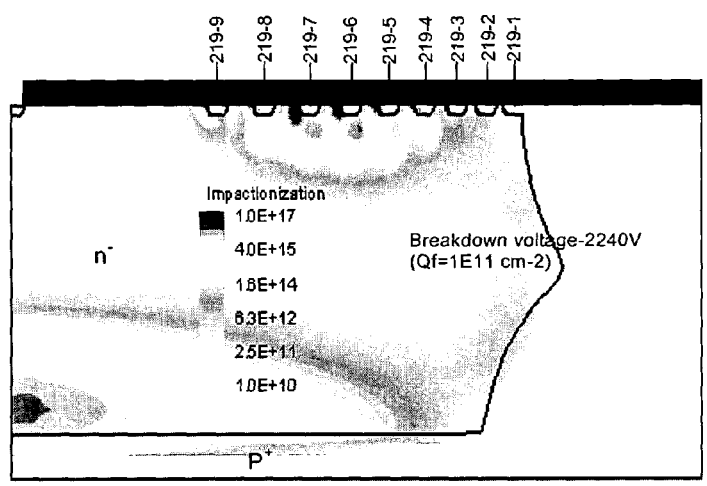

FIG. 12B illustrates the device 62 that is characterized by aluminum lateral diffusion of 75% of the aluminum junction depth. That is, the lateral diffusion is 5% greater than that of FIG. 12A. This could occur due to the process variation. The first guard ring 219-1 is included within the aluminum diffusion and does not contribute in sharing the potential. The remaining eight rings 219-2 to 219-9 share the potential. The breakdown voltage of the resulting device was determined to be 2240 volts, or degradation of the only 1% from the default configuration (from 2260 volts to 2240 volts).

Figure 12C:
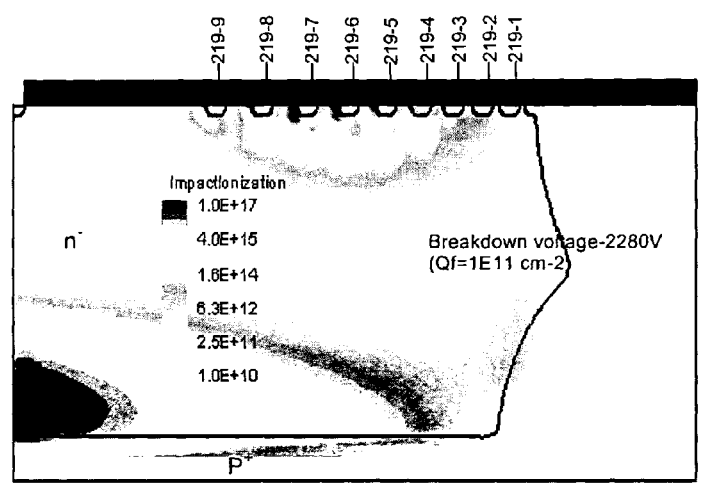

FIG. 12C illustrates the device 62 that is characterized by aluminum lateral diffusion of 65% of the aluminum junction depth. That is, the lateral diffusion is 5% less than that of FIG. 12A. The breakdown voltage increases slightly from 2260V to 2280V. Accordingly, the device 62 with multiple shallow guard rings 219 show low sensitivity to process variation affecting the isolation diffusion structure.

Figure 13:
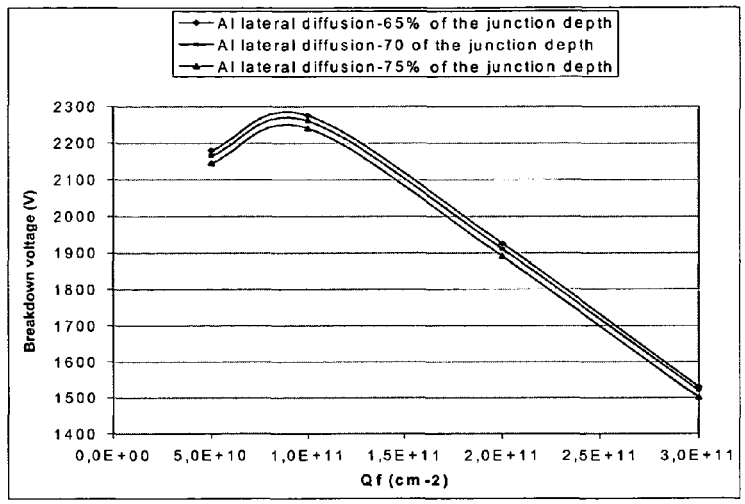
FIG. 13 shows the influence of oxide charge on the reverse breakdown voltage of a power device.
Figure 14A:
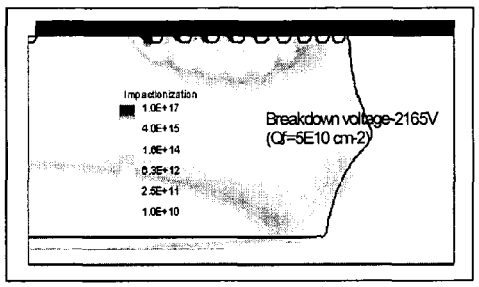
FIGS. 14A-14D show the impact ionization and reverse blocking voltages of power devices having various oxide charges.
Figure 14B:
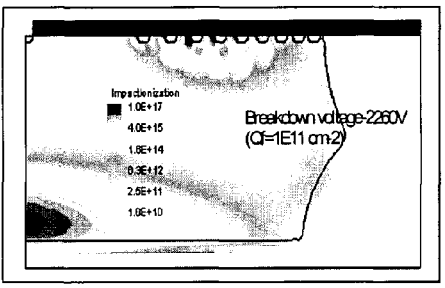
Figure 14C:
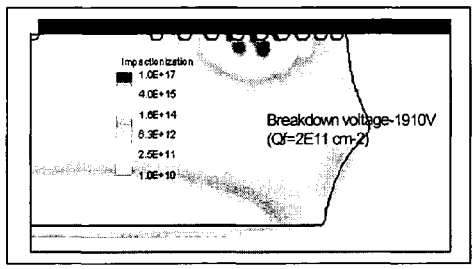
Figure 14D:
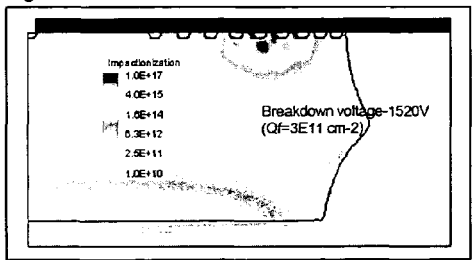

FIG. 13 shows the influence of oxide charge on the reverse breakdown voltage of the device 62. At low fixed oxide charge of 5E10 cm−2, the breakdown voltage is less in comparison to the charge of 1E11 cm−2 because of high impact ionization at the last ring as shown in FIG. 14A. As oxide charge increases, the breakdown voltage decreases because of high electric field/impact ionization rate in between the rings 219. FIGS. 14B-D show the impact ionization for various oxide charges. According to this experiment, the oxide layer 11 should be formed so that the oxide charge is between 1E11 to 2E11 $cm^{-2}$ after polymid curing for stable reverse breakdown voltage.

While the above is a full description of the specific embodiments, various modifications, alternative constructions, and equivalents may be used. Therefore, the above description and illustrations should not be taken as limiting the scope of the present invention which is defined by the appended claims.

What is claimed is:

1. A power device, comprising:
   a semiconductor substrate of first conductivity having an upper surface and a lower surface;
   a first electrode terminal coupled to a first conductive region provided proximate the upper surface of the substrate, the first electrode terminal being provided over the upper surface of the substrate;
   a second electrode terminal coupled to a second conductive region provided proximate the lower surface of the substrate, the second electrode terminal being provided below the lower surface of the substrate;
   an isolation diffusion region of second conductivity provided at a periphery of the substrate and extending from the upper surface to the lower surface of the substrate, the isolation diffusion region having a first surface corresponding to the upper surface of the substrate and a second surface corresponding to the lower surface;

a peripheral junction region of second conductivity formed within the isolation diffusion region, and completely surrounded by the isolation diffusion region, and formed proximate the first surface of the isolation diffusion region; and a passivation layer provided over the upper surface of the substrate, the first surface of the isolation diffusion region, and the peripheral junction region, the passivation layer comprising a polyimide layer and an oxide layer;

wherein the peripheral junction region is different than the first conductive region and the second conductive region, and the peripheral junction region is in direct contact with the oxide layer, and wherein the first electrode terminal and the second electrode terminal define a vertical electrical current path therebetween.

2. The device of claim 1, wherein the peripheral junction region is a P+ region and the isolation diffusion region is a P region.

3. The device of claim 1, wherein the peripheral junction region is provided to compensate the surface depletion of dopants in the isolation diffusion region.

4. The device of claim 1, wherein the oxide layer contacts the upper surface of the substrate, the first surface of the isolation diffusion region, and the peripheral junction region.

5. The device of claim 1, wherein the peripheral junction region is provided to compensate the surface depletion of dopants in the isolation diffusion region and increase a reverse blocking voltage of the device by reducing an electric field at the first surface of the isolation diffusion region.

6. The device of claim 1, wherein the device is a diode and the first electrode terminal is spaced apart from the isolation diffusion region.

7. A power semiconductor device comprising:
a semiconductor substrate of first conductivity type having an upper surface and a lower surface;
a first region disposed proximate the upper surface of the substrate;
a first electrode disposed on the upper surface of the substrate and electrically coupled to the first region;
a second region of second conductivity type proximate the lower surface of the substrate;
a second electrode disposed on the lower surface of the substrate and electrically coupled to the second region;
an isolation diffusion region of second conductivity type provided at a periphery of the substrate and extending from the upper surface of the substrate to the lower surface of the substrate;
a peripheral junction region of second conductivity type disposed adjacent the upper surface and formed within the isolation diffusion region, the isolation diffusion region completely surrounding the peripheral junction region at the periphery of the substrate;
a layer of silicon dioxide disposed over the upper surface of the substrate overlying at least the isolation diffusion region, the peripheral junction region and at least some of the upper surface of the substrate;
a layer of polyimide overlying the layer of silicon dioxide;
wherein the peripheral junction region is spaced apart from the first conductive region and the second conductive region, but is in direct contact with the silicon dioxide layer, and
wherein the first electrode terminal and the second electrode terminal define a vertical electrical current path therebetween.

8. A power semiconductor device as in claim 7 wherein the first electrode comprises a cathode and the second electrode comprises an anode.

9. A power semiconductor as in claim 8 wherein the first conductivity type is n conductivity type and the second conductivity type is p conductivity type.

10. A power semiconductor as in claim 7 wherein the first region is first conductivity type.

11. A power semiconductor as in claim 7 wherein the first region is second conductivity type.

12. A power semiconductor as in claim 7 wherein the first region includes a lower portion of second conductivity type and an upper portion of first conductivity type.

* * * * *